United States Patent
Schriel et al.

(10) Patent No.: US 8,842,959 B2
(45) Date of Patent: Sep. 23, 2014

(54) INCREASED CONNECTOR PORT DENSITY VIA EXTENDING FACEPLATE

(75) Inventors: James Michael Schriel, Kanata (CA); Rami Labib, Ottawa (CA)

(73) Assignee: Alcatel Lucent, Boulogne-Billancourt (FR)

( * ) Notice: Subject to any disclaimer, the term of this patent is extended or adjusted under 35 U.S.C. 154(b) by 156 days.

(21) Appl. No.: 13/536,359

(22) Filed: Jun. 28, 2012

(65) Prior Publication Data

US 2014/0003774 A1 Jan. 2, 2014

(51) Int. Cl.
*G02B 6/00* (2006.01)

(52) U.S. Cl.
USPC ........... 385/135; 361/725; 361/796; 439/131; 439/540.1

(58) Field of Classification Search
CPC .. G02B 6/4452; G02B 6/4453; G02B 6/4455; H05K 7/1425; H05K 7/1418; H05K 7/1448; H05K 7/1458; H05K 9/0067; H01R 24/62; H01R 9/2416
USPC ......... 385/135; 361/796, 725; 439/131, 540.1
See application file for complete search history.

(56) References Cited

U.S. PATENT DOCUMENTS

| | | | | |
|---|---|---|---|---|
| 4,686,608 | A * | 8/1987 | Hosking | 361/827 |
| 5,995,377 | A * | 11/1999 | Tusler et al. | 361/796 |
| 6,089,453 | A * | 7/2000 | Kayser et al. | 235/383 |
| 6,120,307 | A * | 9/2000 | Nagel et al. | 439/131 |
| 7,057,904 | B2 | 6/2006 | Bundza et al. | |
| 8,120,922 | B2 * | 2/2012 | Randall et al. | 361/725 |
| 8,542,973 | B2 * | 9/2013 | Fabrykowski et al. | 385/135 |
| 2002/0145858 | A1 * | 10/2002 | Hayashi et al. | 361/798 |
| 2002/0181922 | A1 * | 12/2002 | Xin et al. | 385/135 |
| 2004/0235344 | A1 * | 11/2004 | Kleeberger et al. | 439/540.1 |
| 2005/0135770 | A1 * | 6/2005 | McClellan et al. | 385/135 |
| 2005/0265010 | A1 * | 12/2005 | Bundza et al. | 361/796 |
| 2008/0175552 | A1 * | 7/2008 | Smrha et al. | 385/135 |
| 2010/0054685 | A1 * | 3/2010 | Cooke et al. | 385/135 |
| 2011/0280537 | A1 * | 11/2011 | Cowen et al. | 385/135 |

FOREIGN PATENT DOCUMENTS

| | | |
|---|---|---|
| CN | TW531990 B | 5/2003 |
| JP | 2690705 | 12/1997 |

OTHER PUBLICATIONS

Notification of Transmittal of the International Search Report and the Written Opinion of the ISA, or the Declaration in PCT/CA2013/050495 dated Oct. 4, 2013.

* cited by examiner

*Primary Examiner* — Peter Radkowski
(74) *Attorney, Agent, or Firm* — Kramer Amado, P.C.

(57) ABSTRACT

An increased connector port density assembly is disclosed for providing more connector ports than would normally fit on a faceplate. The increased connector port density assembly includes a stationary board and an extendable board connected to the stationary board on rails and with cabling. The extendable board has a first and second set of forward facing connector assemblies. The first set accessible when the extendable board is in either the retracted or extended position, whereas the second set of connector assemblies is accessible when the extendable board is in the extended position. The increased connector port density assembly is particularly useful for overcoming faceplate connector area availability limitations known in the art.

19 Claims, 4 Drawing Sheets

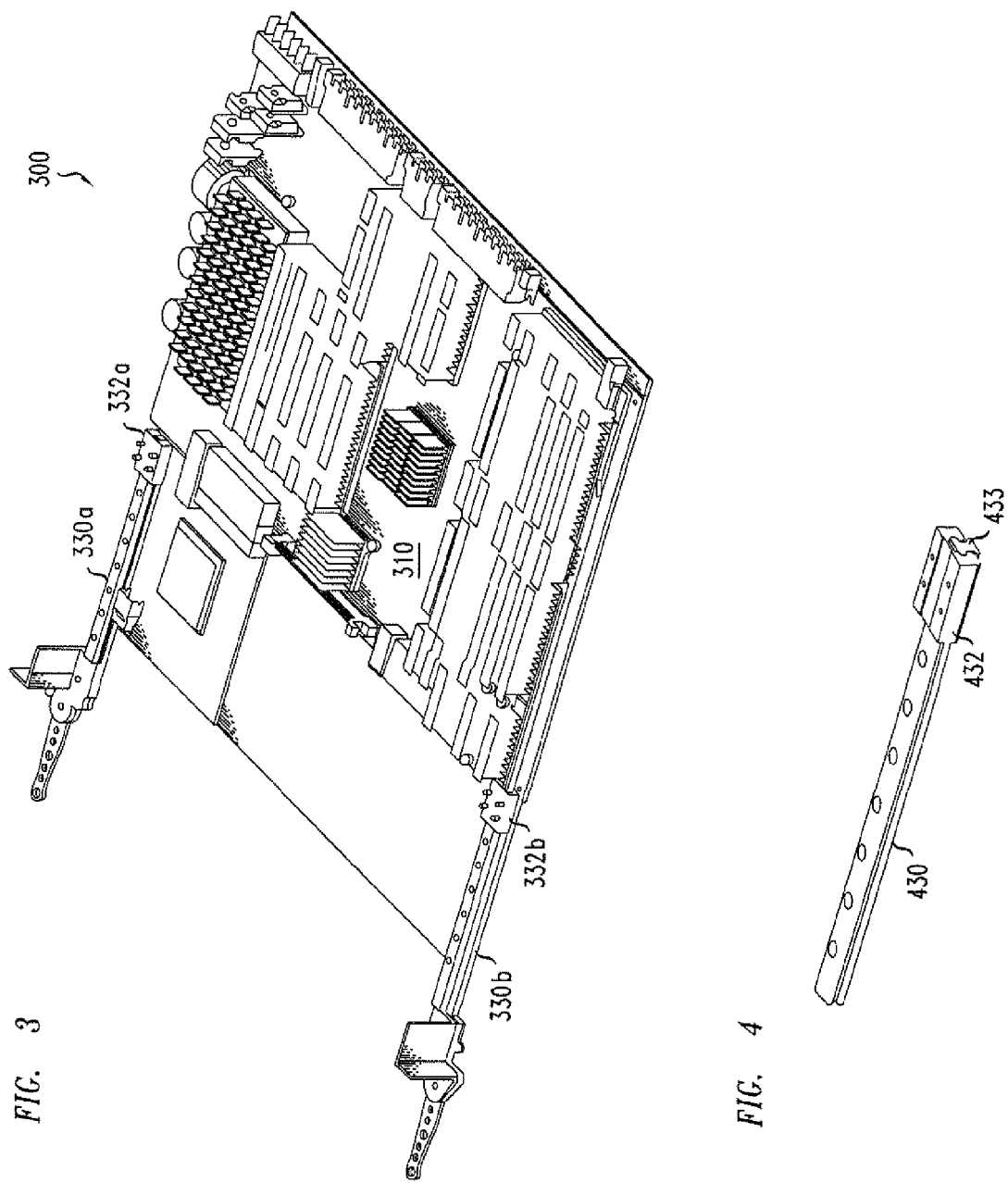

INCREASED CONNECTOR PORT DENSITY VIA EXTENDING FACEPLATE

FIELD OF THE INVENTION

The invention relates to generally to providing increased connector port density and is particularly concerned with providing more connector ports than may mechanically reside on the faceplate of a circuit card.

BACKGROUND OF THE INVENTION

The use of printed circuit board assemblies mounted in shelves is well known in electronic systems. Typically these printed circuit board assemblies are oriented vertically and disposed adjacent to each other across the width of the shelf. The vertical disposition facilitates cooling via air flow, either convective or forced, and facilitates access to the separate assemblies independent of each other.

These assemblies typically comprise printed circuit boards with interconnecting conductive traces for components mounted thereon, and a connector for connection to a backplane or midplane. The components and their compatible connectors are typically electronic and optical in nature. These printed circuit board assemblies normally have a faceplate disposed at the outermost edge of the printed circuit board, opposite the edge having the connectors which interface with the backplane or midplane.

The faceplate may be engineered to provide a variety of mechanical functions, such as stiffening or a mounting point for ejectors providing mechanical leverage for removing the assembly from the shelf; as a mounting point for components such as displays, switches and connectors; and as a component of electrical functions such as one portion of an EMC/RFI shield for the assembly.

As the servicing and cleaning of optical fibers and connectors at a backplane or midplane can present certain physical access difficulties, a faceplate is a preferred mounting point for optical connectors. As may be apparent, the quantity of such components is limited by the mounting area provided by the faceplate. Attempts to increase connector density by decreasing the size of the pluggable media are limited by standard form factors for commonly used media, whereas attempts to increase the faceplate area are limited by the shelf height and given printed circuit board assembly spacing across the shelf.

In view of the foregoing, it would be desirable to provide a means for increasing the quantity of connectors available at the faceplate which overcomes the above-described inadequacies and shortcomings but works within the dimensioning constraints of standard shelf and connector practices.

SUMMARY OF THE INVENTION

It is an object of the invention to provide a method and apparatus for increasing the connector port density available to a printed circuit board assembly in a shelf with a given height and assembly spacing.

According to an aspect of the invention there is provided a circuit pack assembly for use in an equipment shelf, the circuit pack assembly including: a main assembly for mounting in the equipment shelf; a secondary assembly attached to the main assembly so that the secondary assembly may be placed in an extended position or a retracted position; a first connector on the secondary assembly accessible when the secondary assembly is in the retracted position; and a second connector on the secondary assembly accessible when the secondary assembly is in the extended position.

According to some embodiments of the invention the first connector is substantially in line with the front of the shelf when the secondary assembly is in the retracted position.

In some embodiments of the invention the first connector is an optical connector, and in some of these embodiments the second connector is an electrical connector, while in other of these embodiments the second connector is an optical connector.

In some embodiments of the invention the first connector is an electrical connector, and in some of these embodiments the second connector is an optical connector, while in other of these embodiments the second connector is an electrical connector.

In some embodiments the first connector substantially occupies the shelf front facing area of the circuit pack assembly. In some of these embodiments the first connector has grooves for the passage of a portion of cable and in some embodiments with grooves there is a plate attached to the first connector over the grooves.

Advantageously, in some embodiments there is a rail attached to the main assembly; a carrier slidably attached to the rail; and wherein the secondary assembly is attached to the carrier such that it may be moved from a retracted to an extended position as the carrier slides upon the rail.

Some embodiments include a flexible conductive cable bridging the main assembly and the secondary assembly. In some of these embodiments the flexible conductive cable is a ribbon cable, while in other of these embodiments the flexible conductive cable is a flat flexible cable.

Note: in the following the description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

BRIEF DESCRIPTION OF THE DRAWINGS

The present invention will be further understood from the following detailed description of embodiments of the invention, with reference to the drawings in which like reference numbers are used to represent like elements, and:

FIG. 3 illustrates a portion of the exemplary printed circuit board assembly of FIG. 1 which remains stationary relative to the shelf according to an embodiment of the invention;

FIG. 4 illustrates a guide rail with sliding carrier according to an embodiment of the invention;

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description. It will be appreciated, however, by one skilled in the art that the invention may be practiced without such specific details. Those of ordinary skill in the art, with the included descriptions, will be able to implement appropriate functionality without undue experimentation.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, cooperate or interact with each other. "Connected" is used to indicate the establishment of communication between two or more elements that are coupled with each other.

In the following figures, like reference numbers are used to represent like elements.

Figure 1:
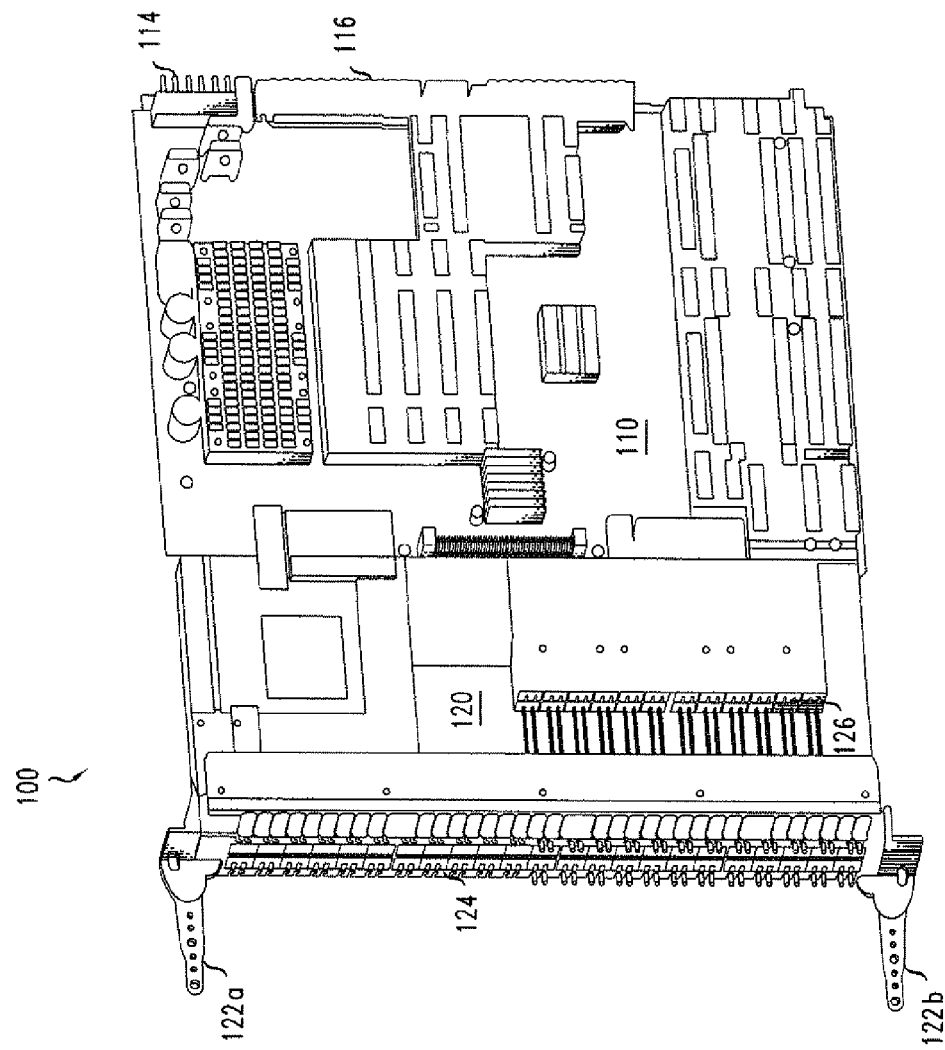
FIG. 1 illustrates an exemplary printed circuit board assembly with connectors in a retracted position according to an embodiment of the invention.

FIG. 1 illustrates an exemplary printed circuit board assembly 100 with connectors in a retracted position according to an embodiment of the invention. Within assembly 100 there may be seen main board 110 having connectors 114 and 116 disposed at one edge for connection to a backplane or midplane. At the opposite end of the assembly 100 may be seen extendable board 120, and assembly 100 ejectors 112a and 112b which serve to mechanically assist in both seating the connectors 114 and 116, securing the assembly 100 in place in a shelf, and in removing the assembly.

Disposed on extendable board 120 are forward facing connector assemblies 124 and 126. As depicted in FIG. 1, connector assembly 124 is in the retracted position, disposed towards the rear end of assembly 100. When mounted in an equipment shelf, the forward facing connector assembly 124 would define the front or outward facing portion of printed circuit board assembly 100. When mounted in a shelf, the effective front of the shelf may be perceived to lie on a line between assembly ejectors 112a and 112b.

Electrical connection between extendable board 120 and stationary board 110 is effected according to one embodiment of the invention, by flat cabling disposed between the two boards which flexes along its length to absorb the relative motion. Selection of the flat cable appropriate to embodiments of the invention would account for the expected bandwidth to be carried over the cables. In low speed applications standard ribbon cable may be appropriate, while in high speed applications use of the high-speed "resilient flex" family of cable from Molex may be appropriate.

Figure 2:
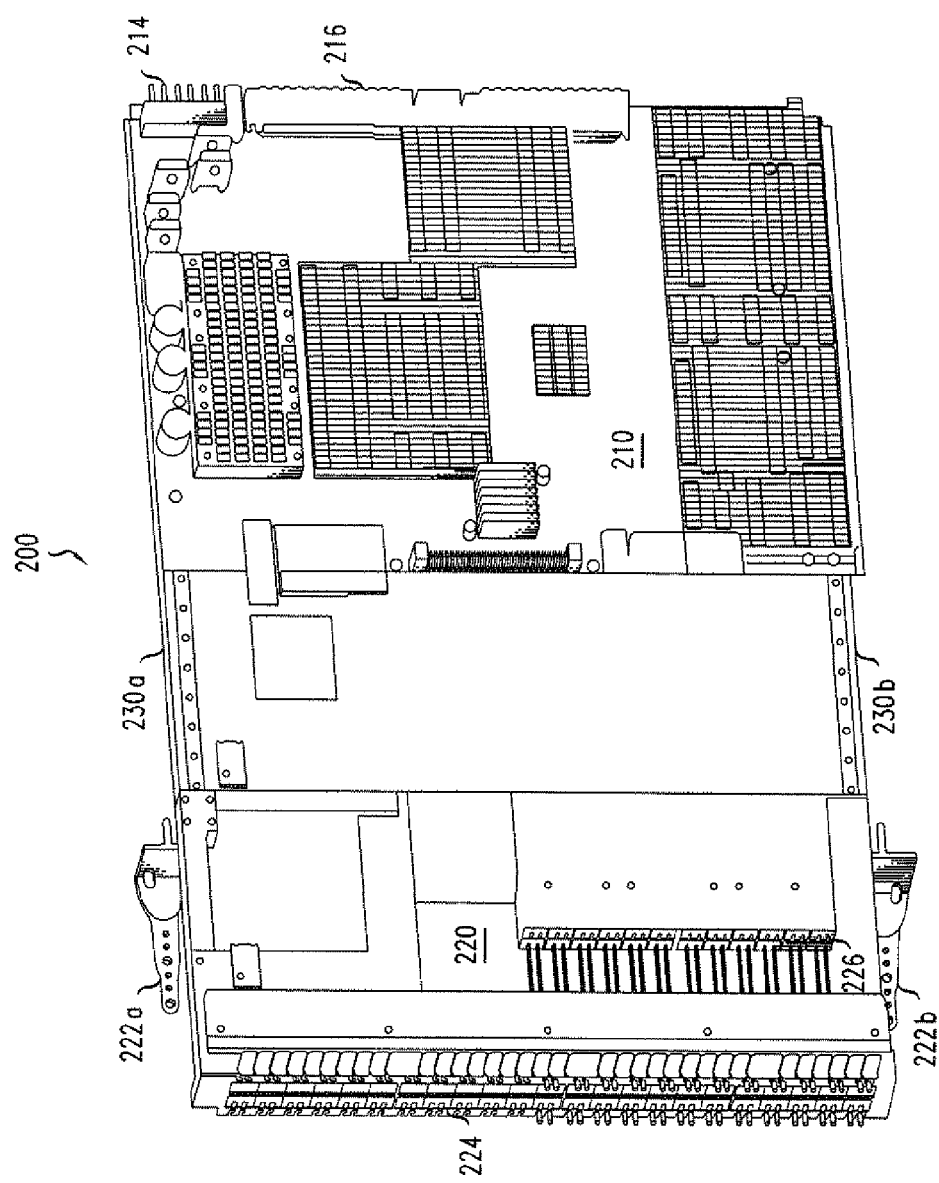
FIG. 2 illustrates the exemplary printed circuit board assembly of FIG. 1 with connectors in an extended position according to an embodiment of the invention.

Referring now to FIG. 2, there may be seen the printed circuit board assembly of FIG. 1 with connectors in an extended position according to an embodiment of the invention. In FIG. 2 there may be seen printed circuit board assembly 200 having main board 210 with back/midplane connectors 214 and 216.

Extendable board 220 has been moved away from main board 210 as may be seen by extendable board 220's position relative to assembly ejectors 212a and 212b. This extended position places the front faces of both forward facing connector assemblies 124 and 126 forward of the front plane of the shelf, insofar as the front plane is established by adjacent cards. This extended position allows access to the forward facing connector assembly 126, which would normally be behind the front plane of the shelf and inaccessible.

Extendable board 220 is mounted on guides, not visible in FIG. 2 but visible in FIG. 4 at 432, which run on rails 230a and 230b disposed at the top and bottom edges of the main board 210. The rails 230 provide mechanical support and alignment to extendable board 220 as it is moved from the retracted position depicted in FIG. 1, to the extended position as depicted in FIG. 2 wherein cables may be connected to forward facing connector assemblies 224 and 226, and as it is moved back to the retracted position.

In use, i.e. while assembly 200 is installed in a shelf, cables may be connected to forward facing connector assembly 224 in either the retracted or extended position. When it is desirous to connect cables to forward facing connector assembly 226, extendable board 220 is moved from the retracted position to the extended position. Cable connectors are then connected to forward facing connector assembly 226. In some embodiments the cable may be threaded through grooves provided on the surface of forward facing connector assembly 224. These grooves are further described in a following figure. Once the cables have been installed in forward facing connector assembly 226, extendable board 220 may be moved back to the retracted position and the face of forward facing connector assembly 226 will then be back in alignment with the remainder of the cards installed in the shelf.

Referring now to FIG. 3, there may be seen the stationary portion 300 of the printed circuit board assembly with the extendable portion removed. Within the stationary portion 300, referred to as stationary as it does not change its position relative to the shelf whether the forward facing connector assemblies are extended or retracted, may be seen main board 310. Mounted on main board 310 at the top and bottom edges are guide rails 330a and 330b respectively. Running along and mechanically secured to the guide rails 330a and 330b are carriers 332a and 332b respectively. These carriers are the mechanical mounting points for the extendable board, and after the extendable board is affixed to the carriers, the carriers' connection to the guide rails provides both alignment and attachment.

Referring now to FIG. 4 there may be seen an exemplary guide rail 430 having carrier 432 with channel 433 mounted thereon. As may be seen by the shape of the cross-section of the guide rail 430, and the shape of the channel 433, the carrier 432 will remain securely mechanically attached to the guide rail 430 while being able to slide along its length.

Figure 5:
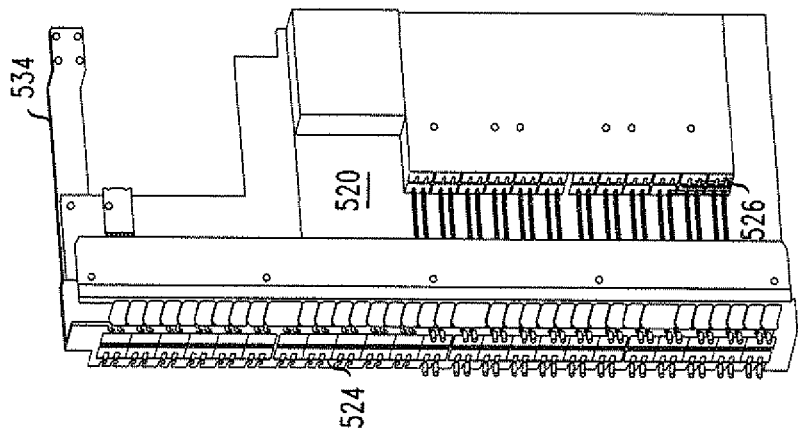
FIG. 5 illustrates a portion of the exemplary printed circuit board assembly of FIG. 1 which is extendable relative to the portion of the exemplary printed circuit board assembly of FIG. 3 according to an embodiment of the invention.

Referring now to FIG. 5, there may be seen the extendable portion 500 of the printed circuit board assembly removed from the stationary portion. Extendable board 520 has forward facing connector assemblies 524 and 526 mounted thereon. Arm 534 connects via fastening means such as screws, bolts, rivets, adhesive or mechanical interlocks to the carrier described in FIG. 4 mounted on the guide rails described in FIGS. 3 and 4.

Figure 6:
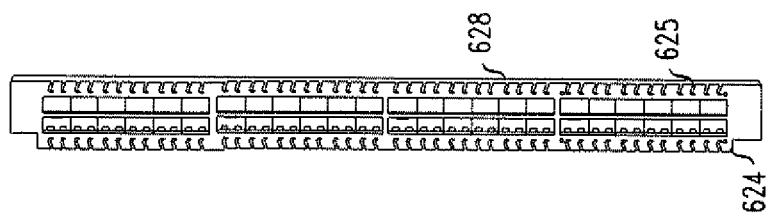
FIG. 6 illustrates a face view of a connector on the portion of the exemplary printed circuit board assembly of FIG. 5.

Referring now to FIG. 6 there may be seen a face view of a forward facing connector assembly 624. The forward facing apertures of grooves 625 may be seen along the left and right sides of forward facing connector assembly 624. In some embodiments a removable plate 628, is used to secure cabling after it is laid in the grooves 625. This plate 628 may operate to provide a continuous surface for the adjacent assemblies' EMI/RFI gasket while mounted in the shelf, or may provide a mounting point for a gasket for this assembly which would mate with an adjacent assembly in the shelf.

Figure 7:
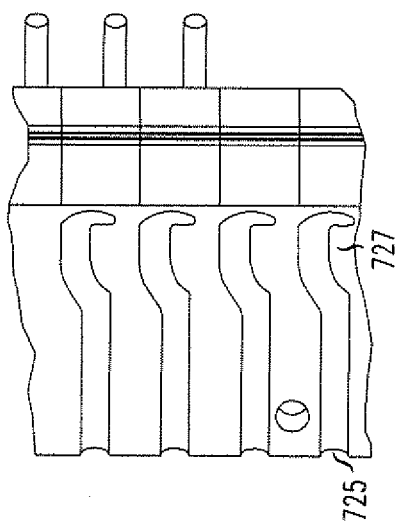
FIG. 7 illustrates a portion of a detailed view of the side of the connector of FIG. 6 according to an embodiment of the invention.

Referring now to FIG. 7 there may be seen a portion 700 of a detailed view of the side of a forward facing connector assembly 724 with the mounting plate removed. Grooves 725 may be seen into which portions of the lengths of cables terminating on the other forward facing connector assembly using may be placed. In this embodiment the grooves 725 have a retaining tab 727 which overhangs the groove and facilitates retention of a cable disposed in the groove prior to the use of plate 628 described in conjunction with FIG. 6.

Therefore what has been disclosed is a means for increasing the quantity of connectors available at the faceplate which overcomes the above-described inadequacies and shortcomings but works within the dimensioning constraints of standard shelf and connector practices.

Numerous modifications, variations and adaptations may be made to the embodiment of the invention described above without departing from the scope of the invention, which is defined in the claims.

What is claimed is:

1. A circuit pack assembly for use in an equipment shelf, the circuit pack assembly comprising:
    a main assembly configured for mounting in said equipment shelf;
    a secondary assembly attached to said main assembly configured so that said secondary assembly may be placed in either an extended position or a retracted position;
    a first connector on said secondary assembly that is accessible when said secondary assembly is in said retracted position; and
    a second connector on said secondary assembly that is inaccessible behind a front plane of the equipment shelf when said secondary assembly is in said retracted position and is accessible when said secondary assembly is in said extended position.

2. The circuit pack assembly as claimed in claim 1, wherein said first connector is substantially in line with the front of the shelf when said secondary assembly is in said retracted position.

3. The circuit pack assembly as claimed in claim 1, wherein said first connector is an optical connector.

4. The circuit pack assembly as claimed in claim 3, wherein said second connector is an electrical connector.

5. The circuit pack assembly as claimed in claim 1, wherein said first connector is an optical connector and said second connector is an optical connector.

6. The circuit pack assembly as claimed in claim 1, wherein said first connector is an electrical connector.

7. The circuit pack assembly as claimed in claim 6, wherein said second connector is an optical connector.

8. The circuit pack assembly as claimed in claim 1, wherein said first connector is an electrical connector and said second connector is an electrical connector.

9. The circuit pack assembly as claimed in claim 1, wherein said first connector substantially occupies the shelf front facing area of said circuit pack assembly.

10. The circuit pack assembly as claimed in claim 9, wherein said first connector further comprises:
    grooves for the passage of a portion of cable.

11. The circuit pack assembly as claimed in claim 10, further comprising:
    a plate attached to said first connector over said grooves.

12. The circuit pack assembly as claimed in claim 1, further comprising:
    a rail attached to said main assembly;
    a carrier slidably attached to said rail, wherein said secondary assembly is attached to said carrier such that it may be moved from a retracted to an extended position as said carrier slides upon said rail.

13. The circuit pack assembly as claimed in claim 1, further comprising:
    a flexible conductive cable bridging said main assembly and said secondary assembly.

14. The circuit pack assembly as claimed in claim 13, wherein said flexible conductive cable comprises a ribbon cable.

15. The circuit pack assembly as claimed in claim 13, wherein said flexible conductive cable comprises a flat flexible cable.

16. The circuit pack assembly of claim 11, wherein the plate is removable.

17. The circuit pack assembly of claim 10, further comprising:
    a retaining tab that overhangs the grooves.

18. The circuit pack assembly of claim 1, further comprising:
    first and second ejectors configured to mechanically assist in seating the first and second connectors.

19. The circuit pack assembly of claim 1, wherein an effective front of the equipment shelf lies substantially on a line between the first and second ejectors.

* * * * *